United States Patent
Lesso

(10) Patent No.: US 9,571,927 B2
(45) Date of Patent: Feb. 14, 2017

(54) DIGITAL/ANALOGUE CONVERSION

(71) Applicant: Cirrus Logic International Semiconductor Limited, Edinborough (GB)

(72) Inventor: John Paul Lesso, Edinburgh (GB)

(73) Assignee: Cirrus Logic International Semiconductor Ltd., Edinburgh (GB)

( * ) Notice: Subject to any disclaimer, the term of this patent is extended or adjusted under 35 U.S.C. 154(b) by 0 days.

(21) Appl. No.: 14/437,685

(22) PCT Filed: Oct. 10, 2013

(86) PCT No.: PCT/GB2013/052640
§ 371 (c)(1),
(2) Date: Apr. 22, 2015

(87) PCT Pub. No.: WO2014/064421
PCT Pub. Date: May 1, 2014

(65) Prior Publication Data
US 2015/0256925 A1  Sep. 10, 2015

Related U.S. Application Data

(60) Provisional application No. 61/719,090, filed on Oct. 26, 2012.

(30) Foreign Application Priority Data

Oct. 26, 2012  (GB) .................................. 1219335.5

(51) Int. Cl.
*H02B 1/00* (2006.01)
*H04R 3/00* (2006.01)
(Continued)

(52) U.S. Cl.
CPC ................. *H04R 3/00* (2013.01); *H03M 1/66* (2013.01); *H03M 3/374* (2013.01); *H03M 3/50* (2013.01)

(58) Field of Classification Search
CPC .......... H04R 3/00; H03G 3/3026; H03M 3/50; H03M 1/66; H03M 3/374; H03M 1/0614; H03M 1/0663; H03M 1/08
(Continued)

(56) References Cited

U.S. PATENT DOCUMENTS 5,128,623 A * 7/1992 Gilmore .................... G06J 1/00
327/107
6,137,429 A  10/2000 Chan et al.
(Continued)

OTHER PUBLICATIONS

International Search Report and Written Opinion, International Patent Application No. PCT/GB2013/052640, mailed Jan. 24, 2014, 11 pages.
(Continued)

*Primary Examiner* — Akelaw Teshale
(74) *Attorney, Agent, or Firm* — Jackson Walker L.L.P.

(57) ABSTRACT

This application relates to digital-to-analogue conversion with improved noise performance. Embodiments relate to digital-to-analogue conversion circuits (300) for converting a digital audio signal to an analogue audio signal having a digital-to-analogue converter (104) operable at a plurality of DAC clock rates. A first clock controller (301-1) controls the DAC clock rate based on an indication of the amplitude of the audio signal. The DAC clock rate ($CK_1$) may be increased for low amplitude signal, where noise is important, to reduce the in-band thermal noise of the DAC. At higher amplitudes, when noise is less audible, the DAC clock rate may be reduced to avoid distortion. The amplitude of the audio signal may be monitored by a digital level detector (302) or in some cases by an analogue level detector
(Continued)

(303). The DAC may be an oversampling DAC with an input interpolator (101) The conversion circuit may also include a word-length reduction module (102) and a dynamic error matching module (103) whose clock rates may also be varied based on the signal.

19 Claims, 3 Drawing Sheets

(51) Int. Cl.
*H03M 1/66* (2006.01)
*H03M 3/00* (2006.01)

(58) Field of Classification Search
USPC .... 381/104, 111, 123, 63, 97, 129, 278, 144
See application file for complete search history.

(56) References Cited

U.S. PATENT DOCUMENTS

| | | | |
|---|---|---|---|
| 6,392,579 B1 | 5/2002 | Rezvani et al. | |
| 6,943,716 B2 | 9/2005 | Mallinson | |
| 7,146,144 B2 | 12/2006 | Robinson et al. | |
| 7,345,607 B1 | 3/2008 | Frigaard et al. | |
| 7,804,434 B2 | 9/2010 | Stoutjesdijk | |
| 7,916,055 B2 | 3/2011 | Chen | |
| 2008/0116979 A1* | 5/2008 | Lesso | H02M 3/07 330/297 |
| 2008/0129563 A1* | 6/2008 | Boomer | H03M 1/1023 341/120 |
| 2008/0246550 A1* | 10/2008 | Biedka | H03C 5/00 332/145 |
| 2009/0033374 A1* | 2/2009 | Lesso | H03L 7/1976 327/105 |
| 2010/0315272 A1* | 12/2010 | Steele | G01D 3/032 341/110 |
| 2012/0242413 A1 | 9/2012 | Lesso | |
| 2013/0107978 A1* | 5/2013 | Thaller | H03B 5/1228 375/295 |

OTHER PUBLICATIONS

Search Report under Section 17 and Combined Search and Examination Report under Section 17 & 18(3), GB Patent Application No. GB1219335.5, dated Feb. 20, 2013, 3 pages.

* cited by examiner

DIGITAL/ANALOGUE CONVERSION

This application relates to digital-to-analogue conversion circuits and especially to switched-capacitor DACs, in particular over-sampled DACs.

Digital-to-analogue converters (DACs) are known and used in a variety of applications. One particular application is within audio signal processing paths. Increasingly audio data is being stored and transmitted in digital format. The digital audio data signal may then be converted within an audio signal path to an equivalent or representative analogue audio data signal, for driving for instance an audio output transducer such as a loudspeaker (e.g. a headphone/earphone speaker) or to be provided as an analogue line-out signal. A DAC may therefore be arranged in such an audio signal path to convert the digital data into a suitable analogue format which may then be amplified to provide the driving/output signal.

Increasing demands on noise performance means that in some applications the target signal-to-noise ratio for audio signals may be in the region of 90-120 dB: i.e. the background noise level should be 90 to 120 dB below the level of the maximum output signal.

In principle a 15 to 20 bit DAC, for example, based on a binary-weighted array of switched capacitors could provide adequate resolution to reduce quantisation noise to these 90-120 dB signal-to-noise ratio levels, though in practice 2 to 4 more bits may be necessary to allow some "noise budget" for the thermal noise associated with these passive elements and any active circuitry within the audio signal path. Providing accurate matching of such an array of elements represents a significant challenge however.

To mitigate this problem of matching array elements, it is known to recode the digital input audio stream into a higher-sample-rate but lower-resolution data stream upstream of the DAC. Typically a digital music audio signal will be coded at sample rate, $f_s$, of 44.1 ks/s (kilosamples per second) or 48 ks/s (or possibly a multiple of these standard rates). Such a digital audio signal could, for example, be recoded into a sample rate of say 64 $f_s$ (i.e. about 3 Ms/s) with a resolution of say 5 bits. This recoded digital domain audio data stream can be converted into the analogue domain by a DAC having the same, or a similar, sample rate and resolution as the audio data stream i.e. 64 $f_s$ and 5 bits. This allows a much simpler and lower-resolution array of passive elements for the DAC and provides the advantage that the quantisation noise may be spread over a much wider frequency band, and may additionally be spectrally shaped using well-known techniques, so the noise actually falling in the audio band is reduced to the level required.

FIG. 1 illustrates a known type of oversampling DAC signal path. Input digital 24-bit (24 b) data at sample rate fs (say 48 kilosamples per second) is received, for example read from some storage medium, such as solid state memory for example. This digital audio input signal is received by interpolation filter 101 which interpolates between these sample points to provide the extra data samples required to provide a data stream at a much higher sample rate, say 64·$f_s$, still at 24-bit (or possible slightly wider to allow for word length increase though the filtering).

The oversampled digital data stream from the interpolator is then received by a word-length reduction module 102, e.g. a delta-sigma modulator, to provide a word length reduced (WLR) digital data stream of say 5-bits at 64·$f_s$. Other known spectral noise-shaping and word-length reduction techniques could additionally or alternatively be applied to the oversampled digital data stream.

In some embodiments the 5-bit data stream could be passed directly to a suitable 5-bit DAC 104 which in turn outputs the corresponding analogue output audio signal. The DAC 104 will typically comprise an array of elements which are programmed by the input signal to generate the required analogue output voltage level.

FIG. 2 shows an example of part of the structure of a known switched-capacitor DAC 104 including two array elements, capacitors C2 and C3. Typically, the capacitance of C3 is suitably weighted with respect the capacitance of C2, e.g. binary weighted so that C3 is twice the capacitance of C2 (C3=2·C2). FIG. 2 thus, for reasons of clarity, only illustrates a simplified 2-bit switched capacitor DAC 104. However, it will be clear to those skilled in the art that a DAC with a resolution of greater than 2-bits could be implemented by extending the number of suitably weighted capacitors in the array.

Although not illustrated, the DAC 104 is driven by a clock at a frequency of 64·$f_s$. In the first half of each clock cycle, capacitors C2 and C3 are each charged up to either VP or VN according to the respective bit of the input data word. In the second half of each clock cycle capacitors C2 and C3 discharge across the feedback capacitor Cf.

In practice there may be some mismatch or ratio error between the capacitor elements C2 and C3 due to manufacturing tolerances and the like. To reduce any errors in the audio-band of the analogue output signal due to such element (C2, C3) mismatches, Dynamic Error Matching (DEM) techniques may be used. To make use of DEM, extra capacitors are included in the DAC capacitor array with weightings such that different combinations of capacitors can be used to provide the required analogue output voltage. Thus, in the case of a 5-bit switched capacitor DAC for example, instead of having just five binary weighted capacitors with weightings 16:8:4:2:1 there may be multiple capacitors at each of various weightings able to provide the required combinations. In the example shown in FIG. 1 for example there may be seventeen capacitors with weightings of 4:2:1 with multiple capacitors for each weighting. This allows various combinations of capacitors to be used with the capacitors being used being varied from sample to sample so that any matching errors will average out.

The word length reduced 5-bit (5 b) digital audio date signal output from the delta-sigma modulator 102 may therefore be received by a Dynamic Error Matching sequencer 103 which appropriately schedules use of each of the various capacitors in the array so as to average out any matching error between capacitors. The DAC analogue output signal may then be passed to an analogue output transducer either directly (line-out) or via a power driver stage, i.e. amplifier, 105. Although not illustrated, the analogue part of the signal path may also include mixing of other analogue signals and/or application of a variable analogue gain.

It will therefore be understood that errors arising from capacitor mismatch in a switched capacitor DAC may be addressed by employing additional selectable capacitors in the array. For a 5-bit switched capacitor DAC the use of seventeen capacitors may be sufficient to allow mismatch to be sufficiently addressed. It will be appreciated however that the greater the resolution of the switched capacitor DAC, the greater the number of different capacitors that are required so as to allow sufficient error matching. Such an increase in the number of such different capacitors may become very large and it may be impractical to employ such DEM techniques on a switched capacitor DAC having a 20-bit resolution. The recoding of the digital input audio data into a faster sample rate but lower resolution signal thus allows practical DACs using DEM techniques to be used.

The charging and discharging of the capacitors in the capacitor array of a switched-capacitor DAC can represent another component of noise in the analogue output signal and so these "switched" capacitors need to be of a size sufficient enough to provide the required performance. Accurately charging and discharging these switched-capacitors will typically require MOS switches of a minimum size to be used in the array and will depend on the settling characteristics of the amplifier used in the switched-capacitor circuit. In practice therefore there is a limit, due to the MOS switches and amplifier characteristics, on the maximum oversampling ratio usable. This is especially the case if the switched-capacitor DAC directly drives the audio transducer.

Embodiments of the present invention are aimed at providing digital-to-analogue conversion circuits with improved noise performance.

Thus according to the present invention there is provided a digital-to-analogue conversion circuit for converting a digital audio signal to an analogue audio signal comprising: a digital-to-analogue converter operable at a plurality of DAC clock rates; and a first clock controller for controlling the DAC clock rate based on an indication of the amplitude of the audio signal.

The first clock controller preferably controls the DAC clock rate such that a first amplitude of the audio signal results in a first DAC clock rate and a second higher amplitude of the audio signal results in a second slower DAC clock rate The digital-to-analogue converter may comprise a plurality of array elements which are switched in response to the input signal to provide the required output signal, wherein the plurality of array elements are configured such that a given output level can be achieved by a plurality of combinations of said elements. A dynamic error matching module may control the switching of the plurality of array elements so as to average out any errors in the transfer characteristics of said elements. In some instances the error matching module is operable at a plurality of DEM clock rates and a second clock controller controls the DEM clock rate of the error matching module based on an indication of the amplitude of the signal being converted. The second clock controller may control the DEM clock rate such that a first signal amplitude results in a first DEM clock rate and a second higher signal amplitude results in a second slower DEM clock rate. The first and second clock controllers may be configured such that the DEM clock rate is substantially always equal to or lower than the DAC clock rate. For at least some signal amplitudes the DEM clock rate may be slower than the DAC clock rate. The DAC clock rate may be substantially always an integer multiple of the DEM clock rate.

The first and second clock controllers may be configured such that a change in signal amplitude leading to a change in DAC clock rate also results in a change in DEM clock rate. The first clock controller may also be the second clock controller. Alternatively there may be at least one change in signal amplitude that leads to a change in only one of the DAC clock rate and the DEM clock rate.

The conversion circuit may comprise a word-length reduction module, such as a delta-sigma modulator, for reducing the resolution of the digital signal upstream of the digital-to-analogue converter. The word-length reduction module may be operable at a plurality of word-length reduction clock rates and a third clock controller may control the word-length reduction clock rate based on an indication of the amplitude of the audio signal. A first signal amplitude may result in a first word-length reduction clock rate and a second higher signal amplitude may result in a second slower word-length reduction clock rate. The first and third clock controllers may be configured such that the word-length reduction clock rate is not greater than the DAC clock rate and/or for at least some signal amplitudes, the word-length reduction clock rate is slower than the DAC clock rate. The DAC clock rate may be substantially always an integer multiple of the word-length reduction clock rate.

The first and third clock controllers may be configured such that a change in signal amplitude leading to a change in DAC clock rate also results in a change in word-length reduction clock rate. The first clock controller may also be the third clock controller. Alternatively the first and third clock controllers may be configured such that there is at least one change in signal amplitude which leads to a change in only one of the DAC clock rate and the word-length reduction clock rate.

The second and third clock controllers, if both present, may be configured such that the word-length reduction clock rate is substantially always equal to or lower than the DEM clock rate.

The conversion circuit may also comprise an interpolator for receiving the digital signal at a first sample rate and producing a digital signal at a faster sample rate, the interpolator being upstream of the digital-to-analogue converter and any delta-sigma modulator. The output sample rate of the interpolator may not vary with signal amplitude. The lowest DAC clock rate may be substantially equal to the output sample rate of the interpolator.

The circuit may comprise a level detector for detecting the amplitude of the signal being converted, with the first sample rate controller being responsive to the level detector. The level detector may monitor the amplitude of the digital signal upstream of the digital-to-analogue converter. The level detector may comprise an envelope detector. Alternatively the level detector may monitor the amplitude of the analogue signal downstream of the digital-to-analogue converter.

The level detector may compare the amplitude of the signal with one or more thresholds and output a control signal to at least the first clock generator indicating whether the signal amplitude is above or below said one or more thresholds. In some instances the level detector may receive a volume signal indicating any volume controlled gain applied to the signal being converted in the signal path between the level detector and the digital-to-analogue converter, and adjust the detected signal level based on said volume signal.

In some instances the indication of the amplitude of the digital signal is received from circuitry upstream of the digital to analogue conversion circuit. In some instances the indication of the amplitude of the digital signal comprises a volume control signal.

In some embodiments the circuit is further operable in an additional mode of operation wherein the clock rate of the DAC does not vary with signal amplitude.

The circuit may further comprise an output stage for amplifying the analogue signal and a variable voltage power supply for providing at least one supply voltage to the output stage, wherein the at least one supply voltage varies based on the output of said level detector.

The conversion circuit may be a delta-sigma digital-to-analogue conversion circuit.

The conversion circuit may be implemented as an integrated circuit.

Embodiments of the invention include audio circuits such as: an audio codec, an audio hub, an audio amplifier circuit; an active noise cancellation circuit; or an audio driver circuit. The circuit may be implemented in an electronic device which may be at least one of: a portable device; a battery powered device; a communications device; a computing device; a laptop computer, a tablet, a mobile telephone; a personal media player; a PDA; or a games device.

In another aspect the invention relates to a method of converting a digital signal to an analogue signal comprising: receiving the signal to be converted at a digital-to-analogue converter; and controlling the clock rate of the digital-to-analogue converter based on an indication of the amplitude of the signal being converted.

The method offers all of the same advantages and can be implemented in the same ways as described with respect to the first aspect of the invention.

In a further aspect there is provided a digital-to-analogue conversion circuit for converting a digital audio signal to an analogue audio signal comprising: a digital-to-analogue converter operable at a plurality of DAC clock rates; and a first clock controller for controllably varying the DAC clock rate based on a characteristic of the audio signal.

In yet a further aspect there is provided a conversion circuit for converting between a digital signal and an analogue signal comprising: a converter operable at a plurality of converter clock rates; and a first clock controller for controlling the converter clock rate based on an indication of the amplitude of the signal being converted such that a first signal amplitude results in a first converter clock rate and a second higher signal amplitude results in a second slower converter clock rate.

The invention also provides a digital-to-analogue conversion circuit for converting a digital signal to an analogue signal comprising: a digital-to-analogue converter; and at least a first digital signal conditioning module for conditioning the digital signal prior to the digital-to-analogue converter, wherein at least one of the digital-to-analogue converter and first digital signal conditioning module is operable at a variable clock rate; and wherein the circuit further comprises a first clock controller for controlling the variable clock rate based on an indication of the amplitude of the signal being converted such that a first signal amplitude results in a first clock rate and a second higher signal amplitude results in a second slower converter clock rate. The first digital signal conditioning module may comprise a dynamic error matching module or a delta-sigma modulator.

The invention will now be described by way of example only with respect to the following drawings, of which:

Figure 1:
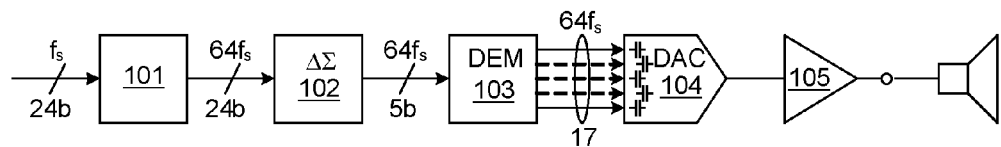
FIG. 1 illustrates a conventional digital-to-analogue conversion circuit.

In embodiments of the present invention a digital-to-analogue conversion circuit comprises a digital-to-analogue converter (DAC) which is operable at a plurality of clock rates and a first clock controller for controlling the clock rate of the DAC based on the amplitude of the signal being converted. The first clock controller may vary the clock of the DAC, during operation, to vary the noise characteristics of the conversion circuit. The first clock controller may vary the DAC clock rate such that a first signal amplitude results in a first DAC clock rate and a second higher signal amplitude results in a second slower DAC clock rate.

Operating the conversion circuit at a faster clock rate has the advantage that components of noise may be spread over a wider frequency band and thus the noise component in the frequency band of interest, typically the audio frequency band, is reduced. However there are practical limits in the maximum clock rate of the DAC that can be used without introducing distortion because the DAC elements have less time to settle at faster clock rates. It has however been appreciated by the inventor that the impact of poor settling of the various DAC elements will be relatively minor at relatively small signal amplitudes. At small signal amplitudes there will only be limited changes in the input data, possibly only changing by the least significant bit (LSB) between data samples, and the signal swings are small enough that that any signal-dependent switching spikes are buried in the noise. Thus, operating a DAC at relatively high clock rates when signal amplitudes are small will provide a benefit in reducing the thermal noise component of the DAC but without any significant impact on distortion.

For relatively larger signal amplitudes any imperfect settling and relatively large signal-dependent switching spikes may significantly affect the perceived quality and distortion of the output signal, i.e. the quality of the resultant sound. Thus for relatively larger signal amplitudes the DAC clock rate may be reduced, e.g. to more conventional clock rates, so as to avoid discernible distortion effects. This will of course increase the in-band noise thermal component but for relatively larger signal amplitudes this noise will be substantially inaudible or at least less objectionable than distortion effects.

Thus to actively manage the background noise so as to be low in the event of silent or low-amplitude audio program material, but, on the other hand, to have good distortion performance for non-silent or high-amplitude audio program material, the clock controller is designed to operate the DAC at a relatively high clock frequency for low-amplitude signals but a relatively low clock frequency for high-amplitude sounds.

In general the clock controller may vary the DAC clock rate in use to provide a desired noise characteristic and distortion characteristic based on the characteristics of the signal and/or operation of the conversion circuit.

Figure 3:
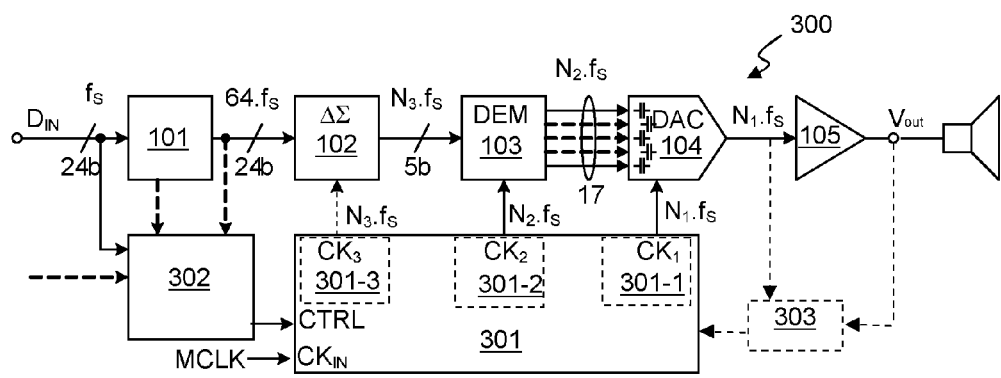
FIG. 3 illustrates a digital-to-analogue conversion circuit according to an embodiment of the present invention.

FIG. 3 illustrates a digital-to-analogue conversion circuit 300 according to an embodiment of the present invention. Similar components to those illustrated in FIG. 1 are identified using the same reference numerals.

The example shown in FIG. 3 shows an input audio signal $D_{IN}$, which may, for example be a 24-bit (or similar typical audio resolution) digital data signal at a given sample rate $f_s$, which may for example be 48 ks/s. As described previously this input digital signal may be received by interpolator 101 to produce an oversampled digital signal at an increased sample rate, say 64 $f_s$ (although clearly other increased samples rates could be used). The increased sample rate, i.e. oversampled, signal may be received by the word-length reduction module 102, which in this example may be a delta-sigma modulator, to produce a reduced resolution version, i.e. a word length reduced version, of the oversampled signal, say a 5-bit signal, which may be received by Dynamic Error Matching (DEM) module 103 to generate suitable control signals for controlling the switching of DAC 104.

The DAC 104 comprises a plurality of array elements (for example capacitors) which are switched in response to the control signals from the DEM module 103 based on the reduced word length signal received by the DEM, so as to provide the required output signal. The plurality of DAC 104 array elements are configured such that a given signal output level of the DAC can be achieved by a plurality of combinations of said elements. The DEM module 103 controls the switching of the plurality of DAC array elements so as to average out any errors in the transfer characteristics of said elements, i.e. any mismatch in respective voltage contribution of an element compared to the nominal voltage contribution, e.g. a mismatch in ratios of capacitance.

The analogue output signal of DAC 104 may be amplified by an output stage 105 and may, for instance be used to drive an output transducer. In some embodiments the DAC 104 may be designed to be able to drive an output transducer directly.

Figure 2:
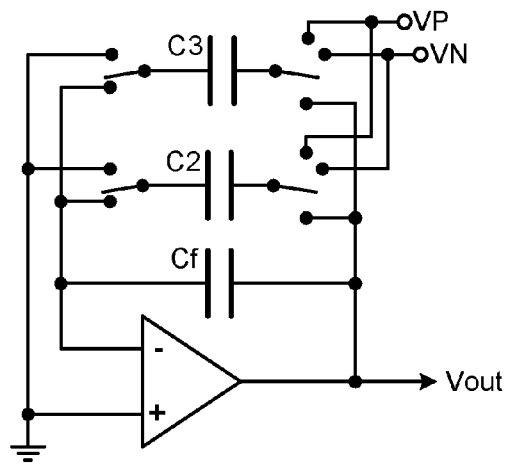
FIG. 2 illustrates the basic structure of a switched capacitor DAC.

In the embodiment shown in FIG. 3 the DAC is operable at a plurality of different clock rates. For a switched capacitor DAC as discussed above with reference to FIG. 2 the switched capacitor elements are controlled such that they are charged to first, VP, or second, VN, voltages depending on the digital input switch control signals to the DAC 104 in one part of a DAC clock cycle and then discharged across the feedback capacitor in the other part of the DAC clock cycle. The DAC clock rate refers to the rate at which the array elements are charged and discharged, i.e. switched between two states. A clock generator 301 controls the clock rate of DAC 104, i.e. the clock generator 301 generates a first clock signal $CK_1$ for controlling the switching of the DAC elements.

The clock generator 301 may receive a master clock signal MCLK from which the DAC clock signal $CK_1$ may be generated and operates to vary the frequency of the first clock signal $CK_1$ based on the amplitude of the audio signal being converted.

Figure 4:
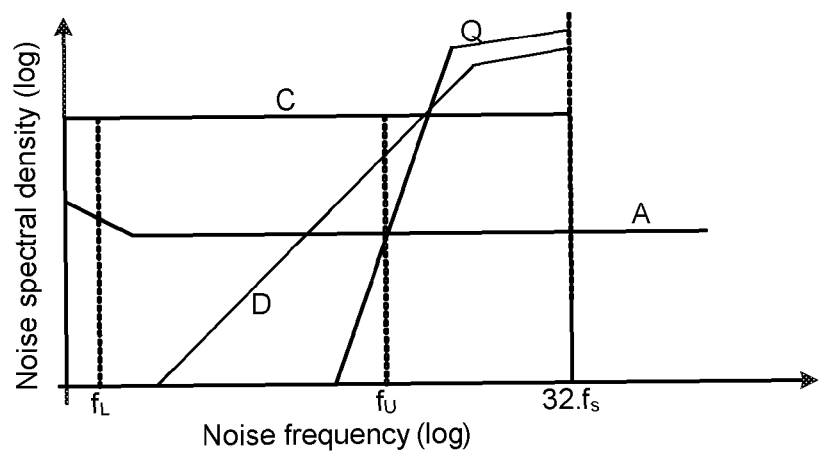
FIG. 4 illustrates the noise components of a digital-to-analogue conversion circuit such as shown in FIG. 1.

FIG. 4 illustrates various components of the output signal noise in a conventional digital-to-analogue conversion circuit such as shown in FIG. 1 where an input signal at $f_s$ (say 44.1 ks/s) is interpolated into a faster sample rate signal, say 64 $f_s$ and then reduced in resolution. Frequencies $f_L$ and $f_U$ denote the lower and upper boundaries of the signal band of interest, which in this example is the audio band, say 20 Hz and 20 kHz respectively.

Line A represents the thermal noise of the operational amplifier 105, including possibly some low-frequency flicker noise.

Line C is the thermal noise, i.e. kTC noise, associated with charging the capacitors of the DAC 104 capacitor array. This is spectrally white, and may be regarded as spread over the band from d.c. to half the switching frequency of the DAC, i.e. 64·$f_s$/2 or 32 $f_s$ (the plot shown ignores any droop that might be caused by the sample-hold of any physical measurement, and also for simplicity does not show noise that might be measured above 32 $f_s$.)

Line Q shows the quantisation noise introduced by the noise-shaping and word-length reduction block 102. Its shape will depend on the order and complexity of the noise-shaping method used, but will generally be very low at low frequencies, but high near 64·$f_s$/2.

There may also be a detectable component D due to DAC capacitor mismatch, despite the DEM circuit 103. The DEM circuit will be designed only to attenuate the mismatch noise to the extent required, i.e. there will be a trade-off between complexity (e.g. area and/or cost of the DEM circuit) and residual noise due to this component.

The total noise (not separately shown) will be the sum of these separate components (plus of course any other sources, such as any quantisation noise already added during digitisation of the original source signal). In this example, the total noise in the audio band will be dominated by the kTC noise of curve C. Noise above $f_U$ will not normally be considered important, as it will be inaudible, and will often be filtered out by the finite bandwidth of any drive amplifier stage 105 or the output transducer, e.g. speaker, itself.

Figure 5:
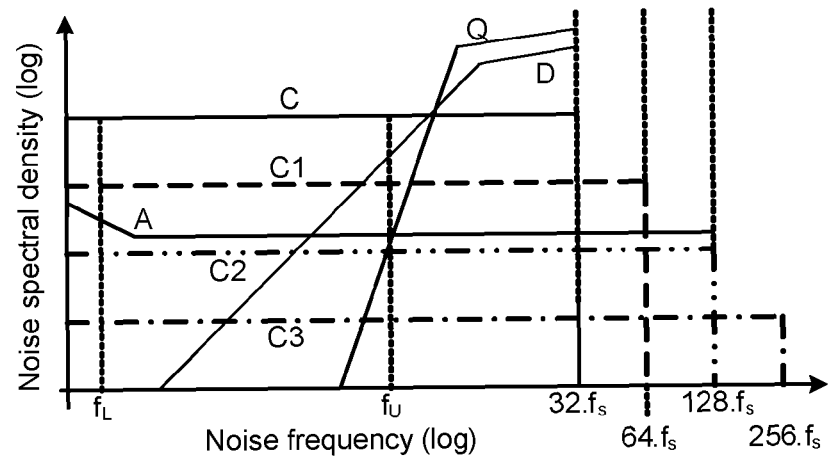
FIG. 5 illustrates the effect on noise of changing the clock rate of the DAC.

FIG. 5 illustrates the effect of increasing the clock rate $CK_1$ of the DAC 104 in the embodiment as shown in FIG. 3. As mentioned the thermal noise can be regarded as being spread evenly in the band from d.c. to half the clock frequency $CK_1$ of the DAC. By increasing the sample rate $CK_1$ of the DAC 104, the thermal kTC noise is spread over a wider bandwidth, thus reducing the amount that appears in the baseband. FIG. 5 illustrates the progressive reduction of this thermal kTC noise component of the audio band noise as the DAC clock rate $CK_1$ is increased from 64·$f_s$ (line C, as before) to 128·$f_s$ (line C1—noise spread between d.c. and 64 $f_s$) to 256·fs (line C2—noise spread between d.c. and 128 $f_s$) and to 512·fs (line C3—noise spread between d.c. and 256 $f_s$).

It can therefore be seen that the noise component associated with thermal noise of the capacitors of the DAC array falling within the audio band may be significantly reduced by increasing the clock rate $CK_1$ of the DAC.

Increasing the clock rate $CK_1$ of the DAC 104 clearly reduces the amount of time available for the capacitors to settle in each DAC cycle. This would typically require use of a more powerful op-amp and bigger switches, with consequent size (and cost) and power requirements, to provide the required distortion performance for large signals. In embodiments of the present invention however the clock rate $CK_1$ of the DAC is reduced at relatively higher signal amplitudes to provide more settling time per DAC cycle and thus relax the requirements of the DAC.

The DAC 104 may therefore be configured to provide acceptable low levels of distortion for the maximum expected amplitude signals when operating at a base clock rate. When relatively high amplitude signals are received the clock generator 301 may control the clock rate of the DAC to be equal to the base clock rate, which in the example illustrated in FIG. 3 for instance may be equal to 64·$f_s$. The DAC thus provides acceptable performance in terms of distortion when relatively high amplitude signals are received and, whilst the thermal noise of capacitors may be a significant component of the total noise in the audio band the noise will be inaudible as the signal amplitude is high.

When operating on relatively lower amplitude signals the clock generator 301 increases the clock rate of the DAC 104. This reduces the thermal noise component due to the DAC elements in the audio band and, although the settling time of the DAC capacitors is reduced the extent of any signal level changes is lower and hence distortion is not so much of a concern.

Referring back to FIG. 3 the clock generator 301 may therefore be responsive to a control signal CTRL from a level detector 302. The level detector may determine the amplitude of the input digital signal $D_{IN}$. In other embodiments however the level detector may operate on the output of the interpolator 101 or on the digital signal at some other part of the signal path prior to the DAC. The detector may include a peak detector or envelope detector. The peak detector may have a relatively fast attack time, for instance an attack time constant substantially equal to zero, so that the DAC clock rate may be reduced quickly when a relatively high amplitude signal is detected to avoid distortion. However in some instances it may be preferable for the detector to react to the average or median of a running set of samples, to avoid reacting to occasional signal spikes, and so a very fast attack time may not be necessary. The peak detector may have a relatively slow decay time relative to the audio bandwidth, for instance a decay time constant of the order of 300 ms (approximately 2π/20 kHz) to avoid frequent changes in the clock rates output by the clock generator 301 when the signal amplitude decreases and increases over a relatively short timescale.

Preferably the signal amplitude is monitored at a location along the digital signal path where the propagation delay along the digital signal path to the DAC is sufficient to allow for the signal amplitude to be determined and the clock generator to implement an appropriate clock rate for the relevant part of the signal before it is received at the DAC: that is to say, information regarding the signal amplitude is used to control the DAC clock rate in a feedforward arrangement.

In some embodiments, especially where the signal amplitude is monitored at a point in the signal path where there is only a limited propagation delay in the signal path to the DAC, the level detector may apply some filtering or signal conditioning to emphasise any signal level increases before peak/envelope detection. This can improve the speed of response of the level detector to any increases in signal amplitude. Thus a filter element (not shown) may be disposed in the signal path before the envelope detector to emphasise any increases in signal level. The filter element could be arranged to combine the received signal with a differentiated version thereof (for instance by diverting the received signal into parallel paths one of which contains a differentiator). Low frequency components of the relevant input signal will be largely unaffected, but high frequency components will be exaggerated. This will exaggerate any rising edges, causing the envelope detector to react sooner than it otherwise would to such increases.

However, exact synchronisation of the change in clock rate of the DAC with changes in signal amplitude appearing at the DAC may not be critical in some applications and a relatively short delay between change in amplitude signal and a consequent change in clock rate of the DAC may be acceptable. In some embodiments the analogue signal in the analogue signal path may be used to determine the amplitude level of the digital signal being converted which may allow a relatively simple analogue peak detector 303 to be used as the level detector: that is to say, information regarding the signal amplitude is used to control the DAC clock rate in a feedback arrangement.

Note that in some embodiments a controlled gain, based for example on a volume setting, may be applied at one or more points along the signal path. If any volume controlled gain is applied to the digital signal upstream of the point where the level detector monitors the signal amplitude the volume controlled gain will inherently be included in the determination of signal amplitude. If volume controlled gain is applied to the analogue signal downstream of the DAC, for instance by controlling the gain of amplifier 105, the amplitude of the signal converted by the DAC will not be affected by the gain. In some embodiments however at least some of the volume controlled gain may be applied to the digital signal before conversion, but downstream of the point at which the digital signal level is determined. The level detector 302 may therefore receive an indication of the volume setting and use such setting in determining the amplitude of the signal being converted. Likewise if a level detector 303 is used to detect the amplitude of the output analogue signal after volume controlled gain has been applied to the analogue signal the level detector 303 may receive an indication of the volume setting.

In some embodiments a volume setting controlling any gain applied upstream of the DAC, e.g. a volume control signal, could be used as the indication of amplitude of the signal being converted. The volume setting may, in effect, determine the maximum or likely maximum amplitude of the signal being converted and this could in some instances be used to control the DAC clock rate.

The clock rate of the DAC is therefore varied in accordance with a signal along the signal path. Conveniently the clock rate of the DAC is kept at substantially an integer multiple of the sample rate of the previous stage in the conversion chain, e.g. the DEM module 103 as illustrated in FIG. 3. In the discussion above with reference to FIG. 5 it was assumed that the DEM continued operation at a sample rate of 64·$f_s$. Conveniently therefore each of the possible DAC clock rates is controlled to be an integer multiple of 64 $f_s$. For the avoidance of doubt the term integer multiple includes a multiple of 1 and thus in some embodiments the DAC clock rate may be set to be equal to 64 $f_s$ for some signal amplitudes.

Clearly if the DAC clock rate is greater than, and a multiple of, the sample rate output from the DEM the same combination of capacitors will be used for a plurality of DAC cycles.

Controlling the DAC clock rate to be a multiple of the DEM sample rate means that an end of a DEM cycle will always correspond with the end of a DAC cycle and thus glitches arising from a DEM cycle changing during the middle of the DAC cycle are advantageously avoided. This does however constrain the useable DAC clock rates to a few distinct values.

Conveniently therefore the DAC clock rate is varied as a step change when the signal amplitude crosses a predetermined threshold. The level detector 302 may therefore compare the detected signal amplitude with one or more thresholds and output an appropriate control signal when a change in clock rate is required. Alternatively the level detector 302 (or 303) may supply an indication of the detected amplitude to the clock generator to make the decision regarding appropriate clock rate. Some amplitude hysteresis may be added to these thresholds, to avoid unnecessary switching between clock frequencies as if the detected signal dawdles close to a threshold. There may also be time-domain hysteresis, i.e. a minimum interval between changes of frequency.

The thresholds will typically be set with regard to the tolerable distortion expected at a given signal amplitude level. The thresholds may be set such that if the signal amplitude decreases the DAC clock rate is changed as soon as possible whilst maintaining desired distortion characteristics. Clearly the threshold will also take into account the relevant change in clock rate. In one embodiment the DAC clock rate may be doubled if the signal level amplitude drops by 12 dB. In this embodiment therefore the threshold may be set so that the clock rate is doubled at each threshold and the thresholds may be set with regard to the expect maximum signal amplitude such that for an amplitude of between 0 dB and −11 dB (i.e. the signal amplitude is less than −12 dB below the maximum) the DAC clock rate is 64 $f_s$. For signal amplitude levels of −12 dB to −23 dB the clock rate may be set to 128 $f_s$ and for signal levels below −24 dB the DAC clock rate may be 256 $f_s$.

In some embodiments the conversion circuit could comprise a remodulator (not illustrated) between the DEM 103 for remodulating the output of the DEM into a form appropriate for the present clock rate of the DAC. This would allow the DAC clock rate to be adjusted to values which are not integer multiple of the DEM sample rate. The remodulator may be any type of suitable sample rate converter.

In some embodiments the clock rate of the DEM 103 and/or word-length reduction module 102, e.g. delta-sigma modulator, may additionally be varied based on the detected signal amplitude level. By varying the clock rates of the DEM and/or the sigma-delta modulator, additional noise reductions in the audio signal band may be achieved for relatively low amplitude signal levels.

Referring back to FIG. 5 it can be seen that in this example, if the DAC clock rate is increased to 512 $f_s$, the thermal noise component has the form illustrated in line C3 and is spread between d.c. and 256 $f_s$, thus significantly reducing the contribution from this noise component in the audio band. If the other clocks of the digital signal processing path are fixed at 64 $f_s$ the noise illustrated by line D—which is due to imperfect suppression by the DEM block of noise due to DAC capacitor mismatch—can then be seen as a relatively significant noise source. In the example shown, where the plots are shown on a log scale, the noise represented by curve D may exceed the amplifier noise illustrated by line A for say the full top octave, i.e. half the linear span, of the audio band.

To mitigate this noise, the DEM 103 may also be operated at increased frequencies to reduce noise.

Figure 6:
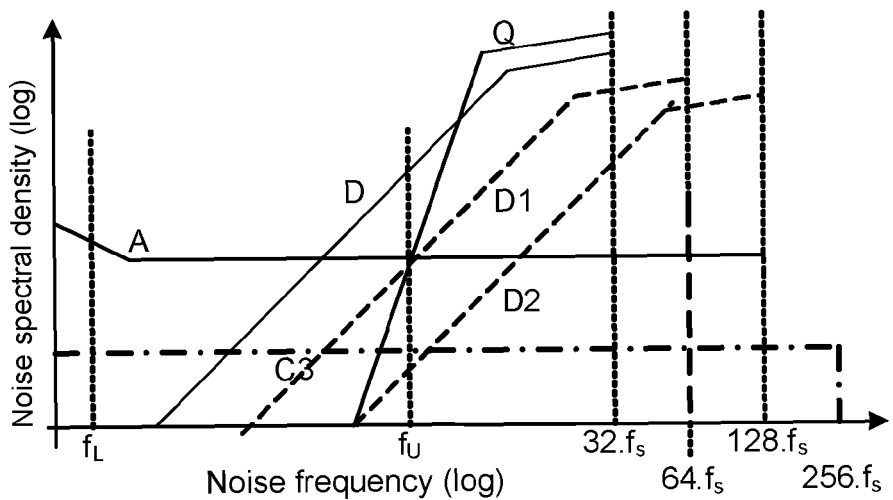
FIG. 6 illustrates the effect on noise of changing the clock rate of a dynamic error matching module.

Referring to FIG. 6, lines D1 and D2 represent the effect on the noise component for operating the DEM 103 with clock frequencies of 128·$f_s$ and 256 $f_s$ respectively. As the DEM clock rate increases the noise component, which is low at low frequencies and increases toward a frequency equal to half the DEM clock rate, shifts to higher frequencies, reducing the amount of noise falling within the audio band.

Note in these cases, the DEM output sample rate is greater than its input rate, so it will generate different capacitor codes in successive DEM output cycles. Though if (as here) the DAC sample rate is still always higher than the DEM sample rate, there will still be a number of repeated DAC samples with the same capacitors. The DEM sample rate may of course be increased to the same as the DAC sample rate of 512·fs, but in this example there would be little benefit in audio band noise and some increase in power consumption from clocking the DEM faster than necessary.

The clock generator 301 may therefore comprise a first clock controller 301-1 for controlling the clock rate of the DAC 104 and a second clock controller for controlling the clock rate of the DEM 103.

In some embodiments the DEM clock rate may always be the same as the DAC clock rate. Thus the same clock signal could be generated and supplied to both the DEM 103 and the DAC 104. As mentioned above however at least some clock rates which may be used for the DAC 104 may not be appropriate for the DEM.

The DEM clock rate may be varied at the same time as the DAC clock rate, but not necessarily every time that DAC clock rate changes or by the same amount. For example, consider that the signal amplitude is high and the DAC and the DEM are both being clocked at a rate equal to 64 $f_s$. If the amplitude level drops past a first threshold the DAC clock rate may be increased to 128 $f_s$, and if the amplitude drops past second and third threshold the DAC sample clock rate may be increased to 256 $f_s$ and 512 $f_s$ respectively. The DEM sample rate may be changed to 128 $f_s$ only at the second threshold and to 256 $f_s$ at the third threshold or the DEM clock frequency may be changed directly from 64 $f_s$ to 256 $f_s$ at the second or third thresholds. It will be noted that in this example each change in clock frequency is a doubling (for a signal amplitude decrease or a halving for a corresponding increase). Changing the clock frequency by a factor of two ensures that the DAC clock rate is always an integer multiple of the DEM clock rate (as long as the DEM clock rate is not greater than the DAC clock rate).

In some embodiments however different thresholds may be used for changing the DEM clock rate and the DAC clock rate, based on the anticipated noise contribution at various signal levels.

Figure 7:
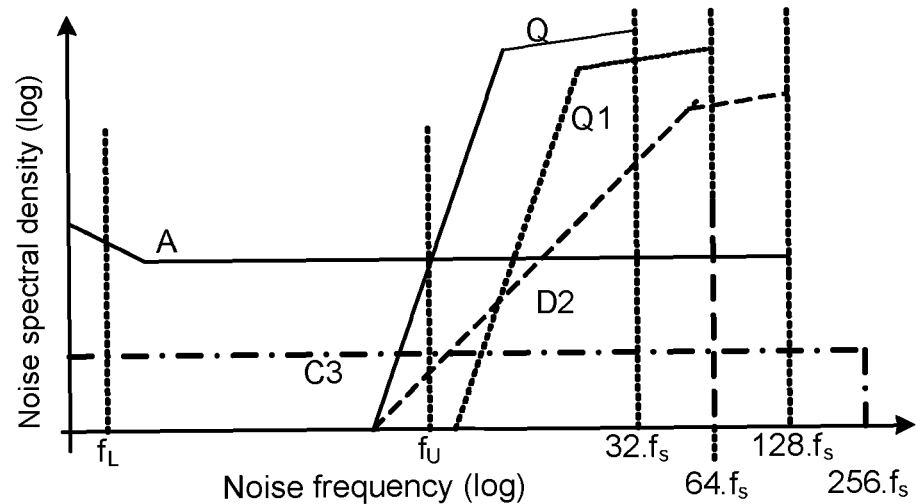
FIG. 7 illustrates the effect on noise of changing the clock rate of a noise shaping block.

FIG. 7 illustrate the output noise components when the DAC is clocked at 512·$f_s$ (line C3) and the DEM at 256·$f_s$ (line D2) and the word-length reduction delta-sigma modulator at 64 $f_s$. The quantisation noise from the delta-sigma is still appreciable at the upper end of the audio band in this illustrated example (and may of course be worse in other examples). Again, by doubling the respective clock frequency, the quantisation noise may be moved up an octave to remove any significant contribution from the audio band. Line Q1 thus illustrates the effect of increasing the clock rate of the delta-sigma modulator to 128 $f_s$—the noise is highest approach half the delta-sigma clock frequency. Thus the clock rate of the delta-sigma modulator may also be variable based on the basis of detected signal and the clock generator 301 may also comprise a third clock controller 301-3 for controlling the word length reduction clock rate.

Note that preferably the word-length reduction clock rate is never greater than the DEM clock rate (but they may at times be equal) and that the DEM clock rate is never greater than the DAC clock rate (but again they may at times be equal). If this is not the case preceding stages will just generate samples that will be ignored by the following stage, and there may be possible undesirable aliasing effects from the sub-sampling.

Provided the delta-sigma modulator, or other word-length reduction element, has a signal transfer function (STF) which is flat somewhat above the audio frequency band, there will not be noticeable audio artefacts due to the sudden change in time constants or noise transfer function (NTF) of the modulator. Any artefacts that might arise due to a variation in transfer function may be reduced by timing the clock rate change of the delta-sigma modulator to occur at or around a zero crossing in the signal. A zero-crossing could be detected by a suitable zero-crossing detector and/or information about the timing of zero crossings may be available from some upstream processing.

Embodiments of the present invention thus control the clock rate of at least the DAC in a digital-to-analogue conversion circuit so as to reduce the noise in a frequency band of interest, e.g. the audio signal band, at relatively low signal amplitude levels (where any noise may be more noticeable). The clock rate is reduced for relatively high amplitude signals, where noise in the audio band will be masked by the signal, to advantageously reduce the constraints on settling time of the DAC and avoid the need for higher power and/or large components.

It will be noted that the increase in clock frequency, of the DAC or preceding digital blocks, with decreasing input signal will cause an increase in power consumption during periods of low signal amplitude. However, taking a conventional circuit and changing the clock rates in the manner described above would advantageously consume less power than were the amplifier and capacitor sizes rescaled to provide the same reduction in noise from the amplifier or thermal kTC noise of the DAC without an increase in clock rate. The extra chip area required to implement the control functionality is also a lot less than would be required to rescale the amplifiers and capacitors. Increasing the clock rate of a signal processing element, to consume less power, is counter-intuitive in design of digital signal processing paths.

For portable or battery powered devices the increase in clock frequency at low signal amplitudes could be configured to be disabled in response to a control signal, for instance in a power saving mode, at the expense of noise performance. Thus the circuit may be operable in an additional mode where the clock rate of the DAC does not vary with signal amplitude.

Referring back to FIG. 3 it will be appreciated that in some embodiments the digital input signal may already be at an appropriate sample rate and/or resolution. For instance the data may have been stored in a suitable format and/or processed by upstream processing circuitry. Thus there may be no requirement for an interpolation filter 101 and/or a delta-sigma modulator 102. It will also be appreciated that other types of noise shaping or word length reduction module may be used in place of or in addition to delta-sigma modulator 102.

The noise benefits of the embodiments of the invention may also apply to DAC signal paths without DEM modules—for instance with just binary weighted DACs (although the noise due to mismatch errors may be more significant). Thus there may not be any DEM module 103 and the DAC 104 could be any type of switched array DAC.

Embodiments have been principally described in terms of switched capacitor DACs but other type of switched array DACs are known, including DACs with active elements and the principles of the embodiments of the present invention may be equally applicable to such other types of DAC. In general the embodiment of the present invention relate to any type of converter circuit for converting between digital and audio signal where the clock rate of a converter is varied based on an indication of the amplitude of the signal being converted.

Embodiments of the present invention are particularly applicable to audio signals where there is a particular audio signal band of interest and where noise at low amplitude signals may be audible to a listener. The principles apply generally however to any applications where there is a frequency band of interest and where increasing the DAC clock rate at low amplitude levels reduces the in-band noise component. Embodiments of the present invention may be applied to sub-audio bands, for instance in driving haptic transducers or the like, or super-audio, for instance driving ultrasonic transducers.

The embodiments of the present invention use an indication of signal amplitude in controlling at least one parameter of a signal processing chain, i.e. the clock rate of the DAC. The embodiments of the invention described above may be used in a range of audio applications. In at least some of these applications an indication of the signal envelope may be usefully used to control other parameters of the an audio signal processing chain.

For instance in some amplifier circuits, for example in class G/H amplifiers, it is beneficial to adjust the supply voltage(s) provided to the amplifier based on an indication of the amplitude of the signal to be amplified and/or any volume setting applied. Embodiments of the present invention determine the amplitude level of the signal being converted, possibly in conjunction with a volume setting. Thus the level detector may be shared with a control unit for varying the magnitude of the supply voltage to at least a driver output stage, and possibly preceding stages of an audio amplifier circuit. In such embodiments it is clearly important that, in response to increases in signal level, the supply voltage to a stage is increased sufficiently in time for the increased signal level arriving at that stage. Thus the level detector will act on the digital signal sufficiently in advance of the output stage that the supply voltage can be changed in time. The use of a filter element such as described above to emphasise increases in signal level is particularly useful for also controlling supply voltage variations.

Figure 8:
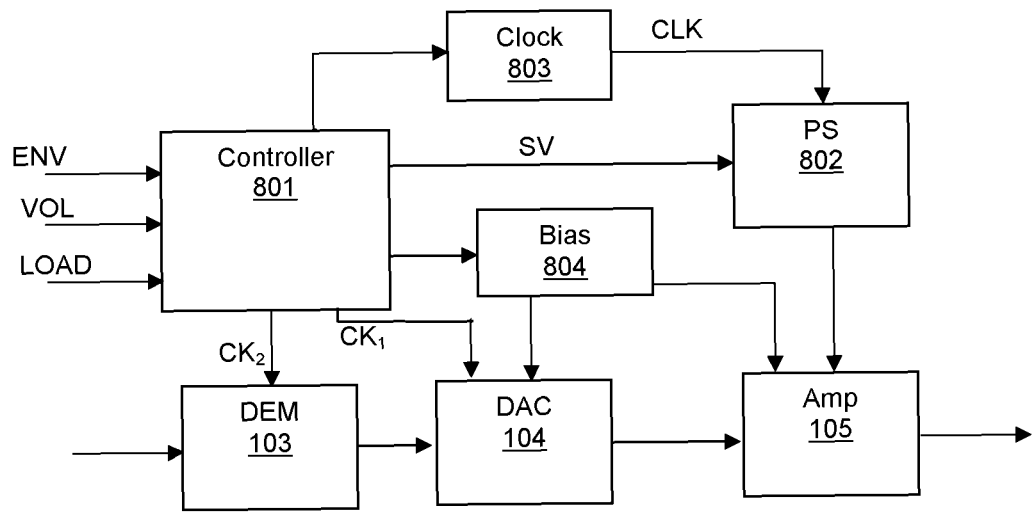
FIG. 8 illustrates a signal processing chain with control of various signal processing parameters according to an embodiment of the present invention.

FIG. 8 illustrates one example of part of an audio signal processing chain comprising a DEM 103, a DAC 104, and an output amplifier 105. As described previously the amplifier 105 may act as an analogue gain element. A controller 801, which may include a clock generator according to embodiments of the present invention, may receive an envelope signal ENV indicative of the envelope signal (for instance from a suitable envelope detector such as described previously). The controller 801 may determine appropriate clock signals $CK_1$ and $CK_2$ for the DAC 104 and DEM103 as described previously. The controller 801 may also generate a supply voltage control signal, SV, to control the supply voltage delivered by variable voltage power supply 802, such as a multi-mode charge pump for example as disclosed in U.S. Pat. No. 7,626,445 to the amplifier stage 105.

It may additionally or alternatively be beneficial to alter the clock frequency applied to a charge pump or other DC-DC converter used to supply power to an amplifier stage according to anticipated load demand, e.g. to reduce switching losses at low load demands. Thus the controller 802 may control power supply clock generator 803 to supply a clock signal CLK to power supply 802 with an appropriate frequency. It will be appreciated that the clock signal to the power supply is reduced in frequency at lower signal amplitudes to save power. As mentioned above increasing the clock frequency to the DAC as lower signal amplitude is counter-intuitive.

In some applications the bias current(s) supplied to various elements, e.g. such as amplifiers and/or a DAC, may be controlled based on an indication of the signal level or load demand. Thus controller 801 may also control a bias generation 804 for supplying bias to one or more elements, e.g. the DAC 104 and/or the amplifier 105, in the signal processing chain.

In some applications with multiple amplifier stages it may be desirable to alter the number of stages of the amplifier used, for instance to optimise power and/or bandwidth with regard to load impedance.

As mentioned the envelope detector described herein may therefore be shared with other control circuitry arranged to implement any or all of these techniques. The controller 801 may also receive a volume control signal VOL. As mentioned above the volume signal may be used in setting the clock rate. The volume signal may also be used by controller 801 in addition to or instead of the envelope signal to control some of the other signal processing elements. In some instance however the indication of signal level may be determine upstream of the digital-to-analogue conversion signal path described herein, for instance in an mp3 decoder or the like. In some instance a parameter of the load such a detected load impedance may additionally or alternatively be used to control some elements of the signal processing path. The controller may therefore receive a control signal LOAD indicative of the load, not illustrated, driven by the amplifier 105.

Digital-to-analogue conversion circuits such as described herein may be used in a range of different applications. In particular the conversion circuits may be used in audio amplifier circuits for generating audio signals for driving an audio transducer such as a headphone, headset or earphone, or an on-board transducer or a host device. Embodiments of the invention may be suitable for active noise cancellation circuits. may be arranged as part of an audio and/or signal processing circuit, for instance an audio circuit which may be provided in a host device. A digital-to-analogue conversion circuit according to an embodiment may be implemented as an integrated circuit and may be implemented in a host device, especially a portable and/or battery powered host device such as a mobile telephone, an audio player, a video player, a PDA, a mobile computing platform such as a laptop computer or tablet and/or a games device for example.

It will be appreciated that the signal path shown in FIG. 8 may be a single audio channel, for instance a mono audio channel or a single channel, e.g. left or right, of stereo data. For stereo, or multi-channel audio, the data may be encoded with separate channels forming part of a single data stream, e.g. the audio data may be divided into frames with left and right channel in separate frames or sub-frames. Upstream processing may therefore have extracted the relevant audio data for the channel which is then sent as single channel audio to the signal processing circuit. In some instance however the data may be received as multi-channel audio and the circuit may be arranged to extract the relevant channel and act only on the audio data for that channel. The signal path could however be a stereo or multi channel signal processing path where the separate channels are extracted and processed in parallel. At least of the signal processing elements may be shared between the parallel channels.

The skilled person will recognise that at least some aspects of the above-described apparatus and methods may be embodied as processor control code, for example on a carrier medium such as a disk, CD- or DVD-ROM, programmed memory such as read only memory (Firmware), or on a data carrier such as an optical or electrical signal carrier. For some applications embodiments of the invention will be implemented on a DSP (Digital Signal Processor), ASIC (Application Specific Integrated Circuit) or FPGA (Field Programmable Gate Array). Thus the code may comprise conventional programme code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Additionally the term "gain" does not exclude "attenuation" and vice-versa. Any reference numerals or labels in the claims shall not be construed so as to limit their scope.

The invention claimed is:

1. A digital-to-analogue conversion circuit for converting a digital audio signal to an analogue audio signal comprising:
   a digital-to-analogue converter operable at a plurality of DAC clock rates; and
   a first clock controller for controlling the DAC clock rate based on an indication of amplitude of the audio signal, wherein the first clock controller controls the DAC clock rate such that a first amplitude of the audio signal results in a first DAC clock rate and a second higher amplitude of the audio signal results in a second slower DAC clock rate.

2. A digital-to-analogue conversion circuit as claimed in claim 1 wherein the digital-to-analogue converter comprises a plurality of array elements which are switched in response to the input signal to provide the required output signal, wherein the plurality of array elements are configured such that a given output level can be achieved by a plurality of combinations of said elements.

3. A digital-to-analogue conversion circuit as claimed in claim 2 further comprising a dynamic error matching module for controlling the switching of said plurality of array elements so as to average out any errors in the transfer characteristics of said elements wherein said error matching module is operable at a plurality of DEM clock rates and the conversion circuit further comprises a second clock controller for controlling the DEM clock rate of the error matching module based on an indication of the amplitude of the signal being converted.

4. A digital-to-analogue conversion circuit as claimed in claim 3 wherein said second clock controller controls the DEM clock rate such that a first signal amplitude results in a first DEM clock rate and a second higher signal amplitude results in a second slower DEM clock rate.

5. A digital-to-analogue conversion circuit as claimed in claim 3 wherein the first and second clock controllers are configured such that, for at least some signal amplitudes, the DEM clock rate is slower than the DAC clock rate.

6. A digital-to-analogue conversion circuit as claimed in claim 3 wherein the first and second clock controllers are configured such that a change in signal amplitude leading to a change in DAC clock rate also results in a change in DEM clock rate.

7. A digital-to-analogue conversion circuit as claimed in claim 3 wherein the first and second clock controllers are configured such that there is at least one change in signal amplitude that leads to a change in only one of the DAC clock rate and the DEM clock rate.

8. A digital-to-analogue conversion circuit as claimed in claim 1 wherein the conversion circuit comprises a word-length reduction module for reducing the resolution of the digital signal upstream of the digital-to-analogue converter wherein said word-length reduction module is operable at a plurality of word-length reduction clock rates and the conversion circuit further comprises a third clock controller for controlling the word-length reduction clock rate based on an indication of the amplitude of the audio signal.

9. A digital-to-analogue conversion circuit as claimed in claim 8 wherein said third clock controller controls the word-length reduction clock rate such that a first signal amplitude results in a first word-length reduction clock rate and a second higher signal amplitude results in a second slower word-length reduction clock rate.

10. A digital-to-analogue conversion circuit as claimed in claim 8 wherein the first and third clock controllers are configured such that, for at least some signal amplitudes, the word-length reduction clock rate is slower than the DAC clock rate.

11. A digital-to-analogue conversion circuit as claimed in claim 8 wherein the first and third clock controllers are configured such that a change in signal amplitude leading to a change in DAC clock rate also results in a change in word-length reduction clock rate.

12. A digital-to-analogue conversion circuit as claimed in claim 1 comprising an interpolator for receiving the digital signal at a first sample rate and producing a digital signal at a faster sample rate, the interpolator being upstream of the digital-to-analogue converter and any delta-sigma modulator wherein the output sample rate of the interpolator does not vary with signal amplitude.

13. A digital-to-analogue conversion circuit as claimed in claim 12 wherein the lowest DAC clock rate is substantially equal to the output sample rate of the interpolator.

14. A digital-to-analogue conversion circuit as claimed in claim 1 comprising a level detector for detecting the amplitude of the signal being converted, wherein the first sample rate controller is responsive to said level detector.

15. A digital-to-analogue conversion circuit as claimed in claim 14 wherein said level detector receives a volume signal indicating any volume controlled gain applied to the signal being converted in the signal path between the level detector and the digital-to-analogue converter, and the level detector adjusts the detected signal level based on said volume signal.

16. A digital-to-analogue conversion circuit as claimed in claim 1 wherein the circuit is further operable in an additional mode of operation wherein the clock rate of the DAC does not vary with signal amplitude.

17. An electronic device comprising a digital-to-analogue conversion circuit as claimed in claim 1 wherein said electronic device is at least one of: a portable device; a battery powered device; a communications device; a computing device; a laptop computer, a tablet, a mobile telephone; a personal media player; a PDA; or a games device.

18. A digital-to-analogue conversion circuit for converting a digital audio signal to an analogue audio signal comprising:
   a digital-to-analogue converter operable at a plurality of DAC clock rates; and
   a first clock controller for controllably varying the DAC clock rate based on amplitude of the audio signal such that a first audio signal amplitude results in a first DAC clock rate and a second, higher, audio signal amplitude results in a second, slower, DAC clock rate.

19. A digital-to-analogue conversion circuit for converting a digital signal to an analogue signal comprising:
   a digital-to-analogue converter; and
   at least a first digital signal conditioning module for conditioning the digital signal prior to the digital-to-analogue converter,
   wherein at least one of the digital-to-analogue converter and first digital signal conditioning module is operable at a variable clock rate; and
   wherein the circuit further comprises a first clock controller for controlling the variable clock rate based on an indication of amplitude of the signal being converted such that a first signal amplitude results in a first clock rate and a second higher signal amplitude results in a second slower converter clock rate.

* * * * *